(12) United States Patent
Furukawa et al.

(10) Patent No.: US 6,989,308 B2
(45) Date of Patent: Jan. 24, 2006

(54) METHOD OF FORMING FINFET GATES WITHOUT LONG ETCHES

(75) Inventors: Toshiharu Furukawa, Essex Junction, VT (US); Mark Charles Hakey, Fairfax, VT (US); Steven John Holmes, Guilderland, NY (US); David Vaclav Hofak, Essex Junction, VT (US); Charles William Koburger, III, Delmar, NY (US); Peter H. Mitchell, Jericho, VT (US); Larry Alan Nesbit, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 10/798,907

(22) Filed: Mar. 11, 2004

(65) Prior Publication Data

US 2005/0202607 A1  Sep. 15, 2005

(51) Int. Cl.
*H01L 21/336* (2006.01)

(52) U.S. Cl. ............... 438/283; 438/157; 438/176; 438/587

(58) Field of Classification Search ............... 438/157, 438/176, 183, 283, 587
See application file for complete search history.

(56) References Cited

U.S. PATENT DOCUMENTS

| 6,605,514 | B1 * | 8/2003 | Tabery et al. ............ 438/303 |
| 6,709,982 | B1 * | 3/2004 | Buynoski et al. ......... 438/696 |
| 6,864,164 | B1 * | 3/2005 | Dakshina-Murthy et al. ............ 438/585 |
| 6,864,519 | B2 * | 3/2005 | Yeo et al. ............... 257/206 |
| 6,927,104 | B2 * | 8/2005 | Lee et al. ............... 438/149 |

* cited by examiner

*Primary Examiner*—Amir Zarabian
*Assistant Examiner*—Khanh Duong
(74) *Attorney, Agent, or Firm*—Wood, Herron & Evans, LLP

(57) ABSTRACT

A method for forming a gate for a FinFET uses a series of selectively deposited sidewalls along with other sacrificial layers to create a cavity in which a gate can be accurately and reliably formed. This technique avoids long directional etching steps to form critical dimensions of the gate that have contributed to the difficulty of forming FinFETs using conventional techniques. In particular, a sacrificial seed layer, from which sidewalls can be accurately grown, is first deposited over a silicon fin. Once the sacrificial seed layer is etched away, the sidewalls can be surrounded by another disposable layer. Etching away the sidewalls will result in cavities being formed that straddle the fin, and gate conductor material can then be deposited within these cavities. Thus, the height and thickness of the resulting FinFET gate can be accurately controlled by avoiding a long direction etch down the entire height of the fin.

10 Claims, 5 Drawing Sheets

METHOD OF FORMING FINFET GATES WITHOUT LONG ETCHES

FIELD OF THE INVENTION

The present invention relates to dual-gated transistors and, more particularly, to FinFETs.

BACKGROUND OF THE INVENTION

A field-effect transistor (FET) is a type of transistor commonly used in Ultra Large Scale Integration (ULSI). In the FET, current flows along a semiconductor path called the channel. At one end of the channel, there is an electrode called the source. At the other end of the channel, there is an electrode called the drain. The physical dimensions of the channel are fixed, but its number of electrical carriers can be varied by the application of a voltage to a control electrode called the gate. The conductivity of the FET depends, at any given instant in time, on the number of electrical carriers of the channel. A small change in gate voltage can cause a large variation in the current from the source to the drain. This is how the FET amplifies signals. In one popular type of FET, known as a MOSFET, the channel can be either N-type or P-type semiconductor. The gate electrode is a piece of metal whose surface is insulated from the channel by a dielectric layer between the gate electrode and the channel and there is little current between the gate and the channel during any part of the signal cycle. This gives the MOSFET an extremely large input impedance.

One recent technique for improving the performance of field-effect transistors involves using dual-gates. In a dual-gated transistor, a top gate and a bottom gate are formed around an active region. Specifically, the advantages for dual gate devices over their single gate counterparts include: a higher transconductance and improved short-channel effects. As a result, higher device on-current is achieved for a given off-current.

Within a dual gate device, the bottom gate must be aligned with the top gate, as well as the source and drain junctions, in order to avoid highly penalizing parasitic capacitance. Furthermore, the top and bottom gates must be connected by a low resistance path having low parasitic capacitances with the other elements present (e.g., substrate, drain, etc.). This alignment has proven very difficult with conventional fabrication techniques and a structure known as FinFET has been proposed as showing promise as a dual-gated device.

A FinFET turns the silicon channel on its side thereby yielding access to a front gate and back gate from the top of the wafer during processing. This makes self-alignment of the source and drain regions and both gates relatively straightforward using conventional lithographic techniques. In a FinFET, the width of the device is determined by the height of the fin.

When fabricating a FinFET using sidewall imaging transfer techniques, the spacer used to define the gate dimension wraps up and down the fin sidewalls. While a taller fin provides a device with more performance, it also results in a longer vertical distance over which the spacer runs. Thus, when etching the gate conductor material along the spacer's edges, the gate conductor must be etched down the entire height of the fin while maintaining a straight vertical profile and while not punching through other layers like the mask, or a protective cap. As a result, as the fins of FinFETs reach larger heights, techniques are needed that allow fabricating gate structures without requiring very long directional etching when forming dimension-critical features of the FinFET such as channel or gate length.

SUMMARY OF THE INVENTION

Accordingly, embodiments of the present invention relate to a method for forming a gate for a FinFET using a series of selectively deposited sidewalls along with other sacrificial layers to create a cavity in which a gate can be accurately and reliably formed. This technique avoids long directional etching steps to form critical dimensions of the gate that have contributed to the difficulty of forming FinFETs using conventional techniques. In particular, a sacrificial seed layer, from which sidewalls can be accurately grown, is first deposited over a silicon fin. Once the sacrificial seed layer is etched away, the sidewalls can be surrounded by another disposable layer. Etching away the sidewalls will result in cavities being formed that straddle the fin, and gate conductor material can then be formed within these cavities. Thus, the height and thickness of the resulting FinFET gate can be accurately controlled by avoiding a long direction etch down the entire height of the fin.

One aspect of the present invention relates to a method of forming a gate for a FinFET. In accordance with this aspect, a first mandrel is formed over a substrate and a gate shape substantially perpendicular to the fin, wherein the mandrel includes a first and second vertical sidewall. The fin may be a silicon fin or be formed of other semiconductor material. A first sidewall spacer is formed on the first sidewall and a second sidewall spacer is formed on the second sidewall. The first mandrel is then removed and a second mandrel, or sacrificial film, is deposited over the sidewall spacers, the fin, and the substrate. A first and a second cavity are created by removing the first and second sidewall spacers from within the second mandrel and a respective gate is formed within each of the first and second cavities. Another aspect of the present invention relates to a FinFET gate structure fabricated using the method described above.

Yet another aspect of the present invention relates to an intermediate structure formed while constructing a FinFET gate. In accordance with this aspect of the invention, the intermediate structure includes a planarized mandrel layer that covers a silicon fin formed on a substrate. This planarized mandrel layer includes a cavity that extends through the mandrel layer thereby exposing a portion of the silicon fin and substrate. More precisely, the cavity has a width that determines a channel length of a first gate portion of the FinFET. Within this cavity, a gate conductor is deposited so as to form the first gate portion over the fin. In accordance with this aspect of the invention, a second cavity can also be formed in the mandrel and filled with gate conductor so as to form a second gate portion of the FinFET.

DETAILED DESCRIPTION

Figure 1:
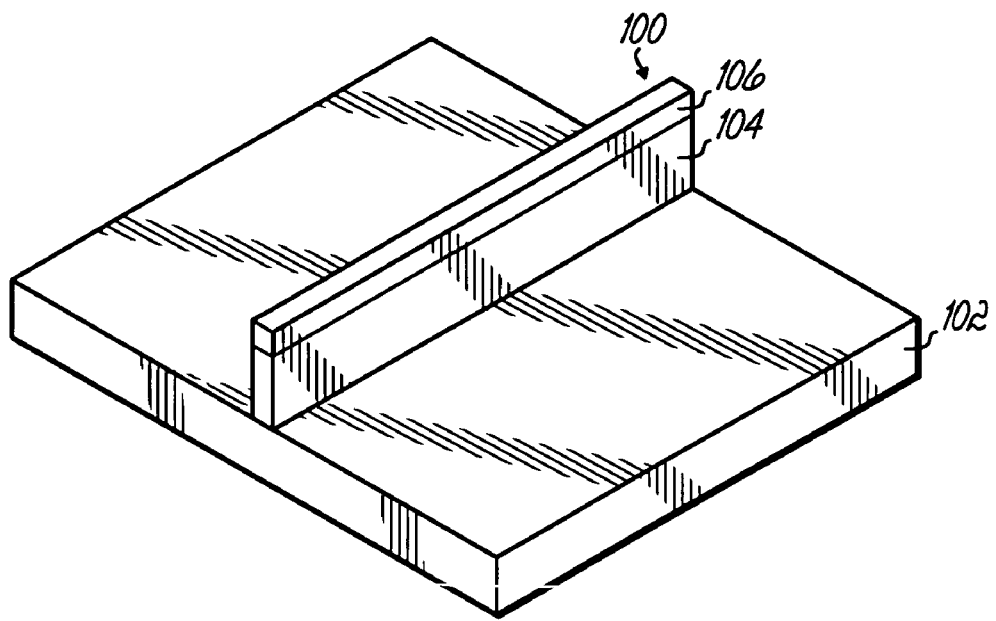
FIG. 1 illustrates a conventionally formed capped semiconductor fin on a wafer.

FIG. 1 depicts an initial structure in forming the FinFET. Using conventional photolithography techniques, a capped semiconductor fin 100, such as silicon, is formed on an insulating substrate 102. The capped semiconductor fin 100 includes protective nitride film 106 that is formed along the top of the semiconductor material 104. Next, referring to FIG. 2, a mandrel 202 is formed across the fin 100. Mandrel 202 is an organic material, the surface of which is then modified by exposure to a sililating agent such as hexamethyl-cyclotrisilazane or hexamethyl-disilazane. This exposure converts the surface of the mandrel 202 to a silicon containing organic polymer. This surface layer is subsequently oxidized in a dry oxygen containing plasma, such as RIE, downstream ozone, or such. As a result, the mandrel 202 is formed so as to facilitate selective oxide growth in liquid phase oxide deposition, but can be selectively stripped with respect to the growth oxide.

The mandrel material is deposited substantially over the entire wafer 102 and fin 100 of FIG. 1 and then planarized and patterned using conventional techniques. If the mandrel material is deposited in a non-conformal manner (e.g., spun on), then no planarization is required. If conformally applied, however, chemical-mechanical polishing is used to planarize the mandrel 202 and RIE or directional etching is used to selectively remove unwanted portions of the mandrel material. Although a variety of feature dimensions can be selected within the scope of the present invention, the exemplary embodiment of FIGS. 1 and 2, utilizes a fin having a thickness between approximately 5 to 100 nm, a height between approximately 30 to 150 nm, and a length of approximately 100 to 150 nm. The dimensions of the mandrel can vary widely but will typically be about twice as tall as the fin 100.

One advantageous method of forming the mandrel 202 is described below although one of ordinary skill would recognize other functionally-equivalent methods are contemplated as well.

The first mandrel 202 is formed of a material that can be used as the underlying substrate for a later step of selectively depositing silicon oxide. The silicon oxide spacers will be formed on the mandrel 202 by selectively growing on the side surfaces of the mandrel 202 without growing on the silicon (or other semiconductor) surfaces of the capped fin 100.

In particular, for oxide deposition to occur, the surfaces of the mandrel 202 should include hydroxy silicon functionalities such as would be provided if the surfaces incorporated therein some hydroxy silicon species. In general, the mandrel 202 is formed from any of a variety of organosilicon polymer materials after which the resulting organosilicon surface is treated with an oxygen plasma to create the hydroxy silicon functionality.

Figure 2:
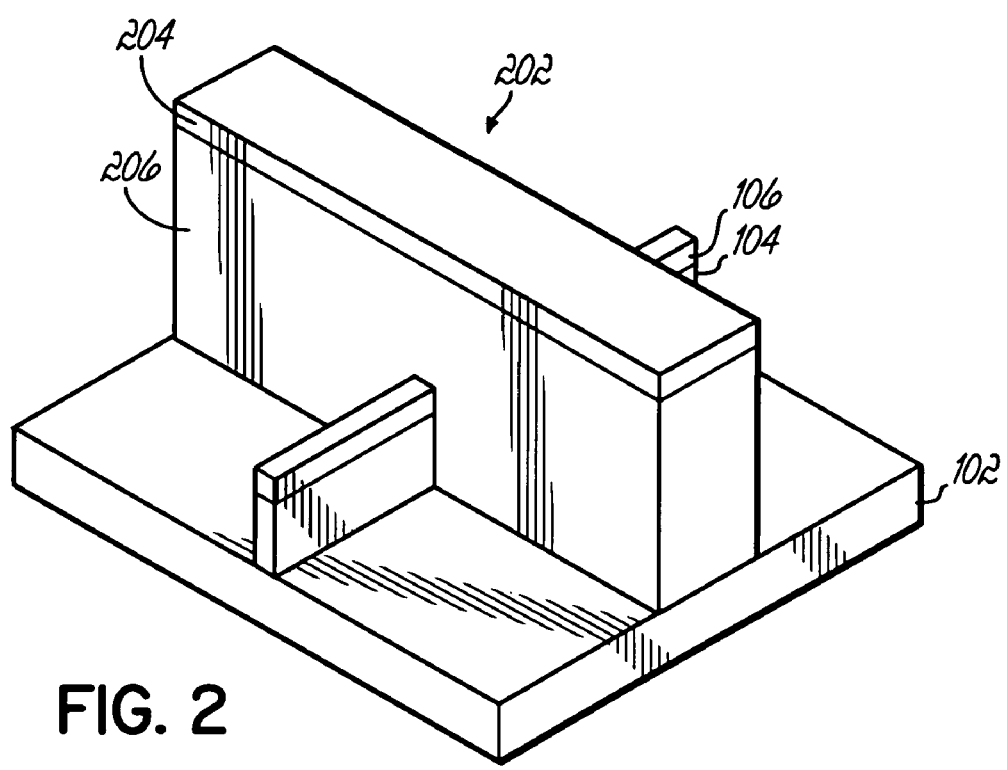
FIG. 2 illustrates a first mandrel formed over the fin of FIG. 1.

Referring now to FIG. 2, one specific embodiment of the present invention includes spin applying a film 206 of organosiloxane bottom anti-reflective coating. In particular, the film 206 is spun-on to a thickness of approximately twice that of the capped fin 100. This intermediate structure (now shown) is soft baked to remove the solvents of the film. An exemplary soft bake is one ramped from 150° C. to 250° C. for about 2 minutes.

After the soft bake, a resist layer 204 is spun over the organosiloxane. The resist layer 204 is exposed and developed to create the mandrel pattern. The organosiloxane is then etched to form the mandrel 202 shown in FIG. 2.

After the mandrel 202 is etched, a brief oxygen RIE step is used to create hydroxy silicon species on the exposed vertical surfaces of the organosiloxane 206. The hydroxy silicon species serve to act as nucleation sites for the selective growth of silicon dioxide. The resist layer 204 remains to act as a mask during the silicon oxide deposition process.

Figure 3:
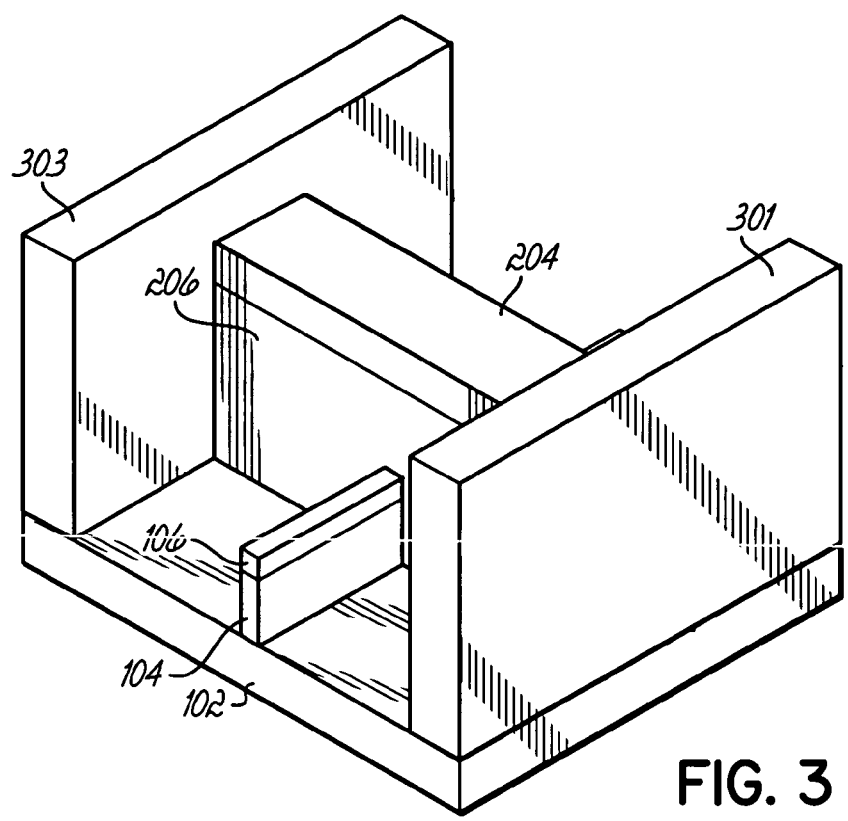
FIG. 3 illustrates a resist layer deposited over the ends of the mandrel of FIG. 2.

Additional resist areas 301 and 303 are formed over the etched mandrel 202 as shown in FIG. 3. This figure shows a resist layer at each "end" of the substrate 102 although alternative embodiments of the present invention contemplate omitting one of these structures. To prevent intermixing between resist layers 301 and 303 with the resist layer 204, an intermediate UV-harden process can be performed. The resist areas 301 and 303 are conventionally patterned so as to be formed in areas where it is not desired to have a sidewall spacer formed.

Once the substrate resembles that of FIG. 3, the silicon surface of the capped fin 100 is cleaned to remove any silicon dioxide. This cleaning is typically performed by using dilute HF, or similar material, to clean the silicon substrate prior to oxide growth.

Figure 4:
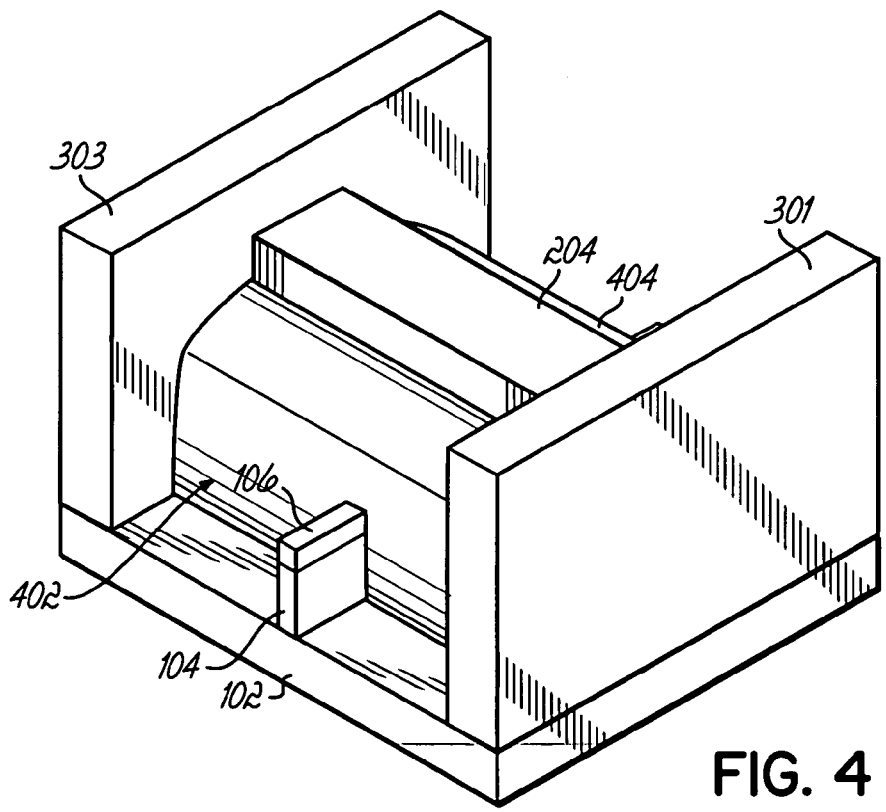
FIG. 4 illustrates sidewalls grown on each side of the mandrel of FIG. 2.

As is conventionally known, liquid phase deposition of silicon dioxide is then performed to deposit oxide on the side surfaces of the mandrel 202. Such as, for example, by immersing the structure in an aqueous bath saturated with silicon oxide at 25–35° C. As a result, the sidewall spacers, or oxide regions, 402 and 404 are formed as shown in FIG. 4.

The thickness of the regions 402 and 404 will determine the desired channel length or gate conductor width, of the resulting transistor and can be controlled with great accuracy. In an advantageous embodiment, each region 402 and 404 are approximately 15–100 nm thick.

Figure 5:
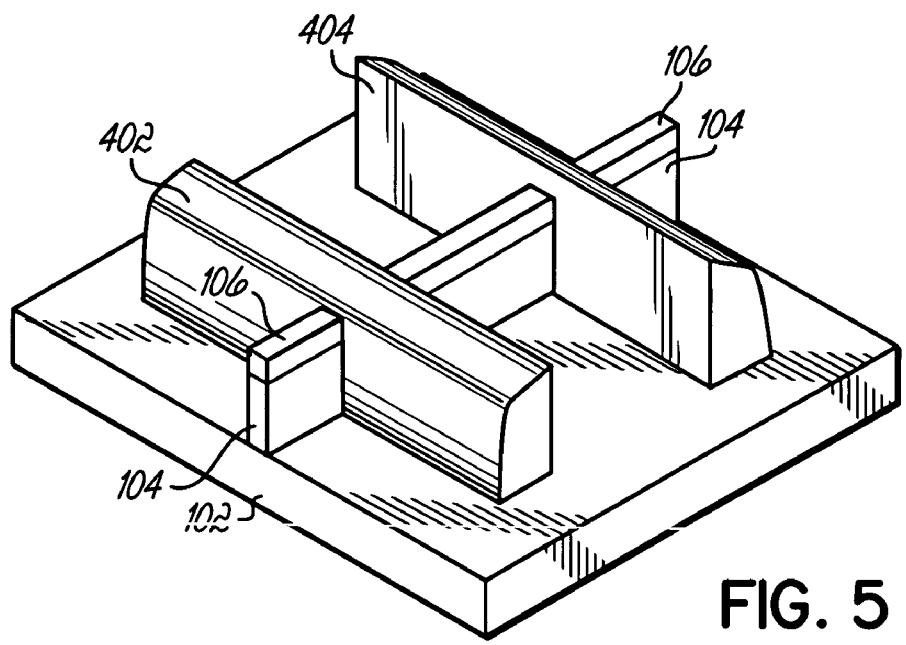
FIG. 5 illustrates the sidewalls of FIG. 4 after the first mandrel is removed.

After the oxide deposition is complete, the organosiloxane 206 is removed with a solvent process such as NE-98 (by ATMI) or CC-1 (by Air Products-ACT). The resist layers 204, 301 and 303 are removed prior to this wet strip process such as by a downstream ozone stripper or other, similar process. The resulting structure is shown in FIG. 5. As shown, the remaining sidewall spacers 402, 404 are no longer supported by the surrounding mandrels and resist layer. Accordingly, as an intermediate step before removing the mandrel 202, TEOS may be deposited so that it is formed between the bottom of each sidewall spacer 402, 404 and the substrate 102. The formation of TEOS, approximately 10–20 Å thick, in this area will adhere the sidewall spacers 402, 404 to the substrate 102 and help stabilize the structure of FIG. 5 during subsequent steps. In the exemplary embodiment depicted in FIG. 5, each sidewall spacer 402, 404 extends on each side of the fin 100 for a distance of approximately 25–100 nm giving the sidewall spacers 402, 404 a total length of between 200–350 nm.

Figure 6:
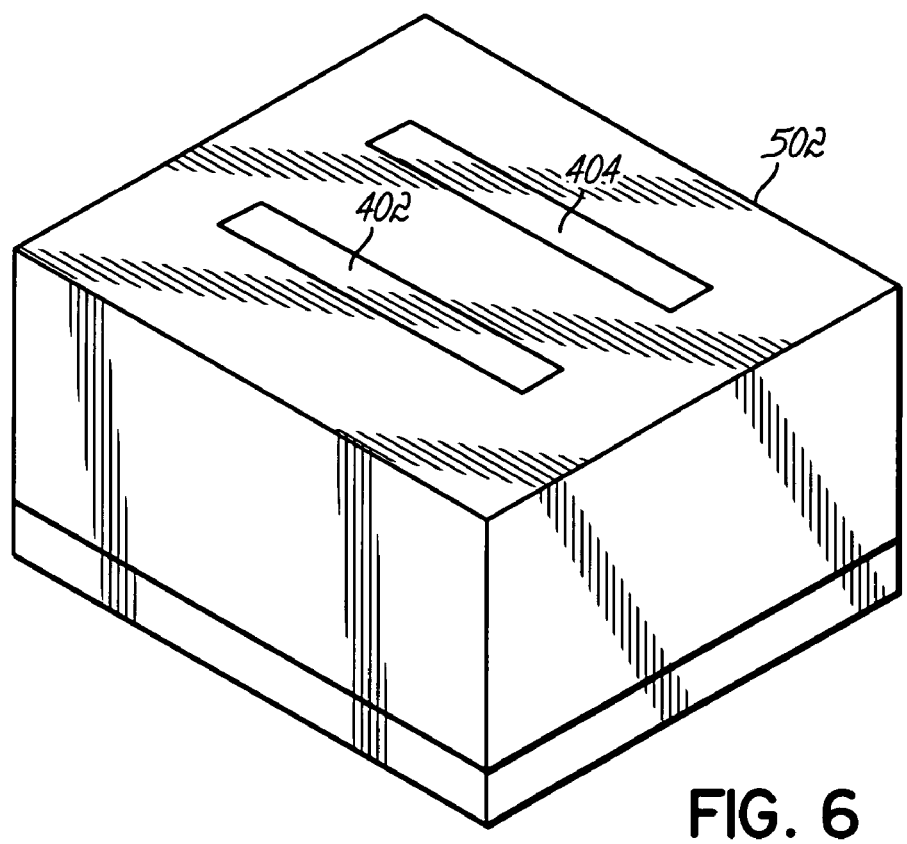
FIG. 6 illustrates a planarized mandrel formed over the sidewalls on the wafer.

This resulting structure is covered with a disposable layer 502 or a second mandrel that is planarized, as shown in FIG. 6, such as by a CMP step. For example, the disposable layer 502 can be an organic fill material that offers etch selectivity with respect to the sidewall spacers 402, 404 and withstands oxidation and high temperatures. One example of such a material is known as "Black Diamond" and is available from Applied Materials. Depending on the subsequent process steps and the temperatures likely to be encountered, disposable layer 502 may be other than an organic fill material. For example, in one alternative, the disposable layer 502 may be Germanium, if the gate process allows it. Furthermore, as FIG. 6 depicts, the planarization of the layer 502 is accomplished until the tops of the sidewall spacers 402,404 are exposed. Chemical-mechanical polishing (CMP) or other planarizing techniques are used to finish the disposable layer 502 to the desired height.

Figure 7:
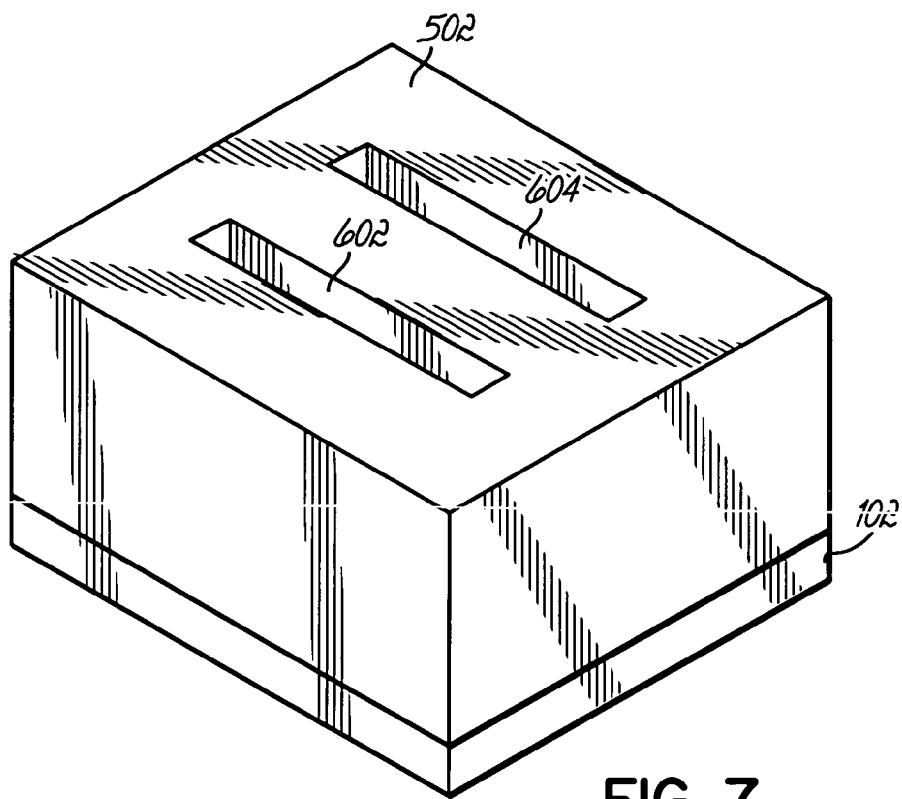
FIG. 7 illustrates the device of FIG. 6 after the sidewalls have been etched away leaving two cavities within the planarized mandrel.

Referring now to FIG. 7, with the tops of the sidewall spacers 402, 404 exposed, a selective etch is performed which removes the sidewall spacers 404, 402 to create respective holes 602,604 through the disposable layer 502. This etch step removes the sidewall spacers 402, 404 without disturbing the fin 100 and substrate 102 that are underneath each portion 402, 404. Thus, with these holes 602, 604 opened, parts of the substrate 102, semiconductor fin 104 and nitride film 106 are exposed.

Figure 8:
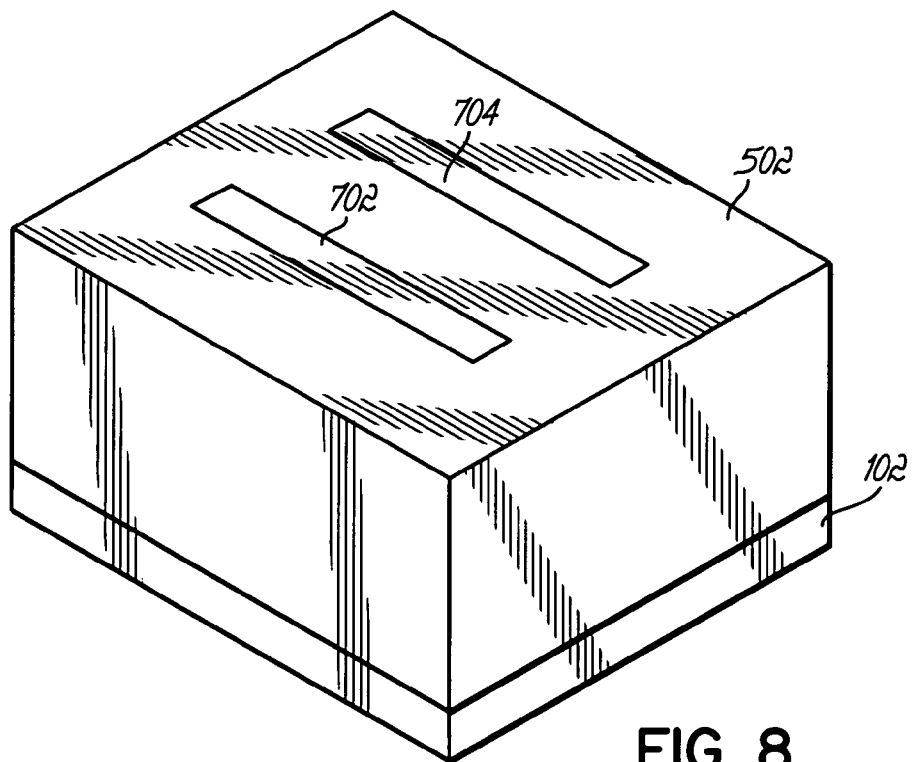
FIG. 8 illustrates the device of FIG. 7 after the cavities have been filled with a gate material.

Optionally, the nitride film 106 that is exposed in each of the holes 602, 604 is etched away allowing for a three-sided gate. This exposes the top of the semiconductor fin 104 in each of the holes 602, 604 and permits the depositing or growth of a gate dielectric on the exposed surfaces (i.e., top and sides) of the fin 104. Once a gate dielectric layer has been formed, the holes 602, 604 are filled with gate material 702, 704, such as polysilicon, as shown in FIG. 8 to form gates on three sides of the fin 104. In one embodiment, the holes 602, 604 are overfilled with gate material 702, 704 and then planarized to the top surface of the disposable layer 502. The disposable layer 502 can now be removed selective to the semiconductor fin 104 and cap 106, as well as to the gate dielectric material (not shown). For example, if the disposable layer 502 is organic material then it can be dry-stripped with oxygen plasma; while if it is Germanium, then hydrogen-peroxide may be used to etch it.

Figure 9:
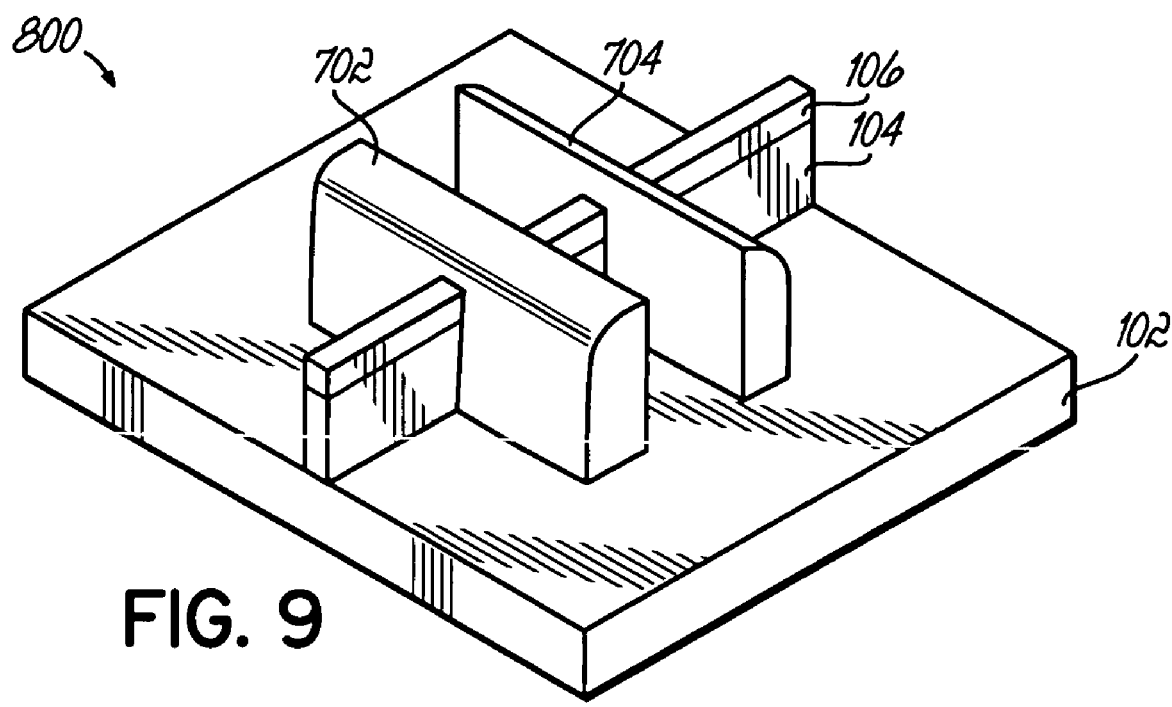
FIG. 9 illustrates the device of FIG. 8 after the planarized mandrel has been removed.

The completed gate structure 800 is depicted in FIG. 9. In particular, the semiconductor fin 104 is straddled by two vertical gate structures 702 and 704 formed atop the substrate 102. Once the structure of FIG. 9 is complete, source and drain areas can be formed, using conventional techniques, on each side of the fin along with contacts and other features if desired. Thus, a method has been described that results in a FinFET gate structure but avoids long directional etches when forming dimension-critical features such as gate or channel length.

Various modifications may be made to the illustrated embodiments without departing from the spirit and scope of the invention. Therefore, the invention lies in the claims hereinafter appended. For example, the step of trimming the sidewall spacers can be performed so as to completely remove the sidewall on one side of the fin thereby leaving only one sidewall spacer over the fin. With this structure in place, only one cavity would be formed when the sidewall spacer is etched away, resulting in a single gate over the semiconductor fin.

What is claimed is:

1. A method of forming a gate for a FinFET comprising the steps of:
    forming a first mandrel over a substrate and a semiconductor fin substantially perpendicular to the semiconductor fin, the mandrel having a first and second sidewalls perpendicular to the substrate;
    forming a first sidewall spacer on the first sidewall;
    removing the first mandrel;
    depositing a second mandrel over the substrate, the semiconductor fin and the first sidewall spacer;
    removing the first sidewall spacer thereby creating a first cavity extending through the second mandrel and exposing the semiconductor fin; and
    forming a first gate conductor within the first cavity.

2. The method of claim 1, further comprising the steps of:
    forming and a second sidewall spacer on the second sidewall;
    depositing the second mandrel over the second sidewall spacer;
    removing the second sidewall spacer thereby creating a second cavity extending through the second mandrel and exposing the semiconductor fin; and
    forming a second gate conductor within the second cavity.

3. The method of claim 2, wherein the step of forming the first sidewall spacer and the second sidewall spacer further includes the steps of:
    growing a first sidewall film on the first sidewall and a second sidewall film on the second sidewall;
    selectively removing portions of the first sidewall film thereby leaving the first spacer straddling the semiconductor fin; and
    selectively removing portions of the second sidewall film thereby leaving the second spacer straddling the semiconductor fin.

4. The method of claim 2, further comprising the step of:
    forming respective gate dielectric material within the first and second cavities on the exposed semiconductor fin, before forming the respective gate conductor in each of the first and second cavities.

5. The method of claim 1, further comprising the step of:
    removing the second mandrel.

6. The method of claim 2, wherein the step of depositing the second mandrel further includes the step of planarizing the second mandrel to a height that exposes the first and second sidewall spacers.

7. The method of claim 1, further comprising the step of:
    forming a protective film on a top surface of the semiconductor fin.

8. The method according to claim 4, wherein the step of depositing respective gate dielectric material further includes the step of:
    removing any protective film within the first and second cavities before forming gate dielectric material.

9. The method of claim 3, wherein the step of growing the first sidewall film and second sidewall film include the step of growing each respective film to a thickness equal to a desired channel length for the FinFET.

10. The method of claim 3, further comprising the step of:
    removing any material that grows on a top surface of the first mandrel during performance of the steps of growing the first and second sidewall films.

* * * * *